United States Patent [19]
Kube

[11] Patent Number: 5,493,232
[45] Date of Patent: Feb. 20, 1996

[54] DISTURBANCE IMMUNE OUTPUT BUFFER WITH SWITCH AND HOLD STAGES

[75] Inventor: Donald H. Kube, San Jose, Calif.

[73] Assignee: VLSI Technology, Inc., San Jose, Calif.

[21] Appl. No.: 850,360

[22] Filed: Mar. 11, 1992

[51] Int. Cl.⁶ .................................................. H03K 19/0185
[52] U.S. Cl. .................................................. 326/27; 326/83
[58] Field of Search .................................. 307/246, 272.2, 307/443, 475; 326/27, 87, 83

[56] References Cited

U.S. PATENT DOCUMENTS

| | | | |
|---|---|---|---|
| 4,477,741 | 10/1984 | Moser, Jr. | 307/473 |
| 4,504,747 | 3/1985 | Smith et al. | 307/475 |
| 4,656,370 | 4/1987 | Kanuma | 307/443 |
| 4,731,553 | 3/1988 | Van Lehn et al. | 307/443 |
| 4,928,023 | 5/1990 | Marshall | 307/443 |
| 5,296,757 | 3/1994 | Koizumi | 307/443 |
| 5,319,260 | 6/1994 | Wanlass | 307/443 |
| 5,332,932 | 7/1994 | Runaldue | 307/443 |

*Primary Examiner*—Edward P. Westin
*Assistant Examiner*—Benjamin D. Driscoll

[57] ABSTRACT

A disturbance immune output buffer is disclosed. The output buffer includes a switch stage and a hold stage. The switch stage utilizes a pull-up transistor coupled to a switch power node and a pull-down transistor coupled to a switch ground node to drive a weak signal from internal circuitry to a corresponding strong signal on an output node. The pull-up transistor and pull-down transistor are then shut off. The hold stage utilizes a pull-up transistor coupled to a hold power node and a pull-down transistor coupled to a hold ground node to maintain the signal on the output node. As a result, a constant output signal is generated which is not effected by disturbances such as transients and noise associated with ground bounce. In addition, since the switch stage transistors are shut off, any ground bounce produced during state transitions of coupled output buffers will not effect sensitive circuit elements.

6 Claims, 4 Drawing Sheets

DISTURBANCE IMMUNE OUTPUT BUFFER WITH SWITCH AND HOLD STAGES

BRIEF DESCRIPTION OF THE INVENTION

The present invention relates generally to output buffers for integrated circuits. More particularly, the present invention relates to an output buffer which includes switch and hold stages which shield the output buffer and its output signals from disturbances such as transients and noise.

BACKGROUND OF THE INVENTION

Output buffers receive signals generated by low power internal circuitry of an integrated circuit and generate corresponding output signals capable of driving a load outside of the integrated circuit. Output buffers include a coupling to a power source and to a ground node. When one or more transistors of an output buffer experience a state change (e.g., going from high to low voltage), current is discharged to the ground node. The ground node is coupled to a lead of an integrated circuit package. The lead of an integrated circuit package possess inductance and resistance. Thus, during a state change in an output buffer, the discharged current experiences inductance and resistance at the ground lead of the package. Consequently, the discharged current produces a ground bounce phenomenon in the form of transients, noise, and noise spikes on the output signal and other circuit elements which are coupled to the ground node. This ground bounce phenomenon may have destructive results for delicate circuit elements such as sense amplifiers. Moreover, the ground bounce produces undesirable transients on what would otherwise be stable signals.

One prior art solution for addressing the problem of ground bounce is to attempt to reduce the package lead inductance. This approach is inherently limited by the physical dimensions of the package and the necessity of having all the leads converge near the integrated circuit. Another prior art solution to the ground bounce problem is to provide multiple power and ground leads. This technique reduces, but does not eliminate disturbances.

OBJECTS AND SUMMARY OF THE INVENTION

It is a general object of the present invention to provide an output buffer which is immune from disturbances such as transients and noise.

It is another object of the present invention to provide a noise immune output buffer which does not rely upon reducing the inductance of a package lead.

It is another object of the invention to provide a stable output signal which is isolated from disturbances.

It is yet another object of the invention to isolate sensitive circuit elements from disturbances.

These and other objects are achieved by a disturbance immune output buffer in accordance with the invention. The output buffer includes a switch stage and a hold stage. The switch stage utilizes a pull-up transistor coupled to a switch power node and a pull-down transistor coupled to a switch ground node to drive a weak signal from internal circuitry to a corresponding strong signal on an output node. The pull-up transistor and pull-down transistor are then shut off. The hold stage maintains the signal on the output node. As a result, a constant output signal is generated which is not effected by disturbances such as transients and noise associated with ground bounce. In addition, since the switch stage transistors are shut off, any ground bounce produced during state transitions of coupled output buffers will not effect sensitive circuit elements.

BRIEF DESCRIPTION OF THE DRAWINGS

For a better understanding of the nature and objects of the invention, reference should be had to the following detailed description taken in conjunction with the accompanying drawings, in which.

Like reference numerals refer to corresponding parts throughout the several views of the drawings.

DETAILED DESCRIPTION OF THE INVENTION

Figure 1:
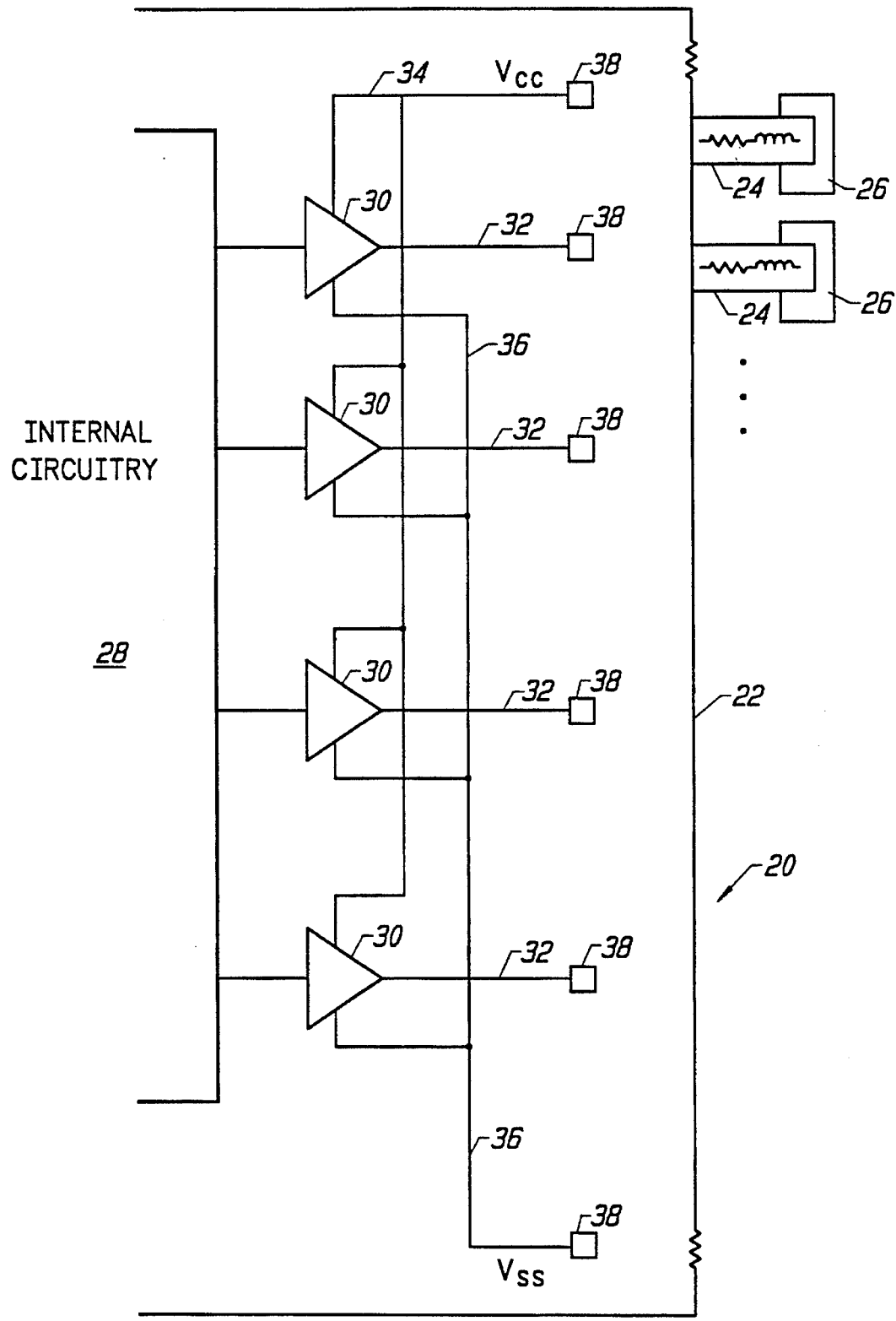
FIG. 1 depicts an integrated circuit package including internal circuitry which is coupled to a plurality of output buffers.

Referring to FIG. 1, an integrated circuit package 20 is disclosed. The integrated circuit package 20 includes a housing 22 and a plurality of leads 24. The leads 24 are coupled to board connections 26.

The integrated circuit package 20 also includes internal circuitry 28 which is coupled to a plurality of output buffers 30. Each output buffer 30 includes a buffer output node 32, a buffer power node 34, and a buffer ground node 36. The output nodes 32, buffer power node 34, and buffer ground node 36 are each coupled to output pads 38. The output pads 38 are coupled to package leads 24 by bond wires (not shown) in a manner known in the art.

As can be appreciated with reference to FIG. 1, each of the output buffers 30 are coupled to a common ground node 36. Thus, when one or more of the output buffers 30 experience a state transition in which current is discharged, the ground node must sink a relatively large amount of current. This current will experience the resistance and inductance inherent with the package lead 26. As a result, the voltage level on ground node 36 will fluctuate, causing a phenomenon commonly called "ground bounce". The fluctuation of the voltage level on the ground node causes the output signals from the output buffer to contain unwanted transients and noise.

Figure 2:
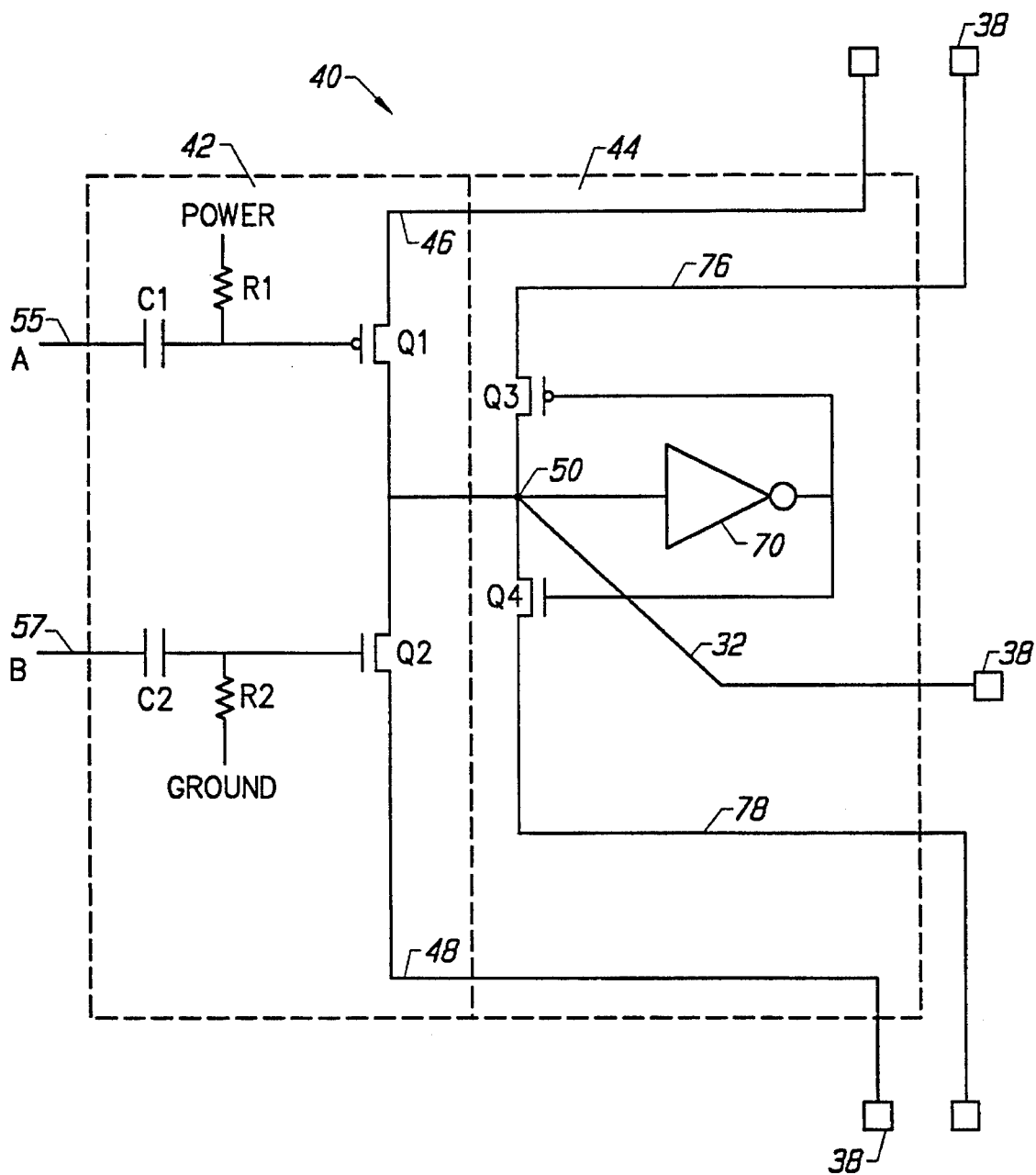
FIG. 2 depicts an output buffer in accordance with the present invention.

These ground bounce problems are largely eliminated in accordance with the output buffer of the present invention. As disclosed in FIG. 2, the output buffer 40 of the present invention includes a switch stage 42 and a hold stage 44. By way of overview, the switch stage is used to execute an output transfer; that is, the switch stage produces a transfer of an output voltage value from an internal node to an output node 32. After the output transfer, the switch stage transistors are turned off, thereby isolating them from ground voltage disturbances such as transients or noise spikes. The hold stage preserves the output transfer, or output voltage value, from the switch stage. In other words, the hold stage generates a constant output value.

Thus, in accordance with the present invention, any ground bounce which is produced during discharge of output buffer current will not effect the transistors in the switch stage, which are turned off. Moreover, the ground bounce will not effect the output signal since the hold stage generates a constant output value.

Now that a general description of the invention and its associated advantages is provided, attention turns to a more detailed consideration of the operation of the invention. Still referring to FIG. 2, the switch stage 42 includes a switch power input node 46, a switch ground node 48, and a buffer output node 50. The switch stage 42 preferably includes a pull-up transistor Q1 and a pull-down transistor Q2. The gate of pull-up transistor Q1 is coupled to an input node 55 with a differentiator including capacitor C1 and resistor R1. The gate of pull-down transistor Q2 is coupled to an input node 57 with a differentiator including capacitor C2 and resistor R2. In the disclosed embodiment, pull-up transistor Q1 is a p-channel device which is coupled to a power source through resistor R1, while pull-down transistor Q2 is an n-channel device which is coupled to ground through resistor R2.

The output buffer 40 receives logic signals from internal circuitry 28 on its input nodes 55 and 57. Often, input nodes 55 and 57 will be connected together to form a single input node. A low logic input to pull-up transistor Q1 and to the pull-down transistor Q2 will turn the pull-up transistor Q1 on, while the pull-down transistor Q2 remains off, therefore providing a high logic signal at the buffer output 50. In the alternative, if a high logic signal is applied to the pull-up transistor Q1 and pull-down transistor Q2, the pull-up transistor Q1 will shut off while the pull-down transistor Q2 turns on, pulling the buffer output 50 node low.

After the output signal is transferred to buffer output node 50, the transistors shut off. That is, pull-up transistor Q1 is turned off through its coupling to power through resistor R1, while pull-down transistor Q2 is turned off through its coupling to ground through resistor R2. Since pull-up transistor Q1 and pull-down transistor Q2 are shut off, the buffer output 50 is isolated from the switching power and switching ground nodes 46 and 48. Therefore, transients or noise on these nodes will not damage coupled electronic components or disturb the output signal. In other words, state transitions by other transistors coupled to switching power node 46 and switching ground node 48 will not cause the ground bounce problems experienced in the prior art.

The operation of the switch stage 42 is augmented by the operation of the hold stage 44. The input to the hold stage 44 is the buffer output 50. The signal received by the buffer output 50 is inverted by hold inverter 70 and is then transmitted to pull-up hold transistor Q3 and pull-down hold transistor Q4. Pull-up hold transistor Q3 is of the same polarity as pull-up transistor Q1 but has a much higher impedance, while pull-down hold transistor Q4 is of the same polarity as pull-down transistor Q2 but has a much higher impedance. In other words, transistors Q3 and Q4 are much smaller and have much less driving capability than Q1 and Q2. Pull-up hold transistor Q3 is coupled to an idling power node 76 and pull-down hold transistor Q4 is coupled to an idling ground node 78.

The hold inverter 70 drives the inverted output voltage value at buffer output node 50 and conveys it to pull-up hold transistor Q3 and pull-down hold transistor Q4, one of which will turn on and hold the output voltage value. For instance, if pull-up transistor Q1 pulled buffer output node 50 high, then this high value will be inverted in the hold stage 44, which will result in pull-up hold transistor Q3 being turned on, thereby maintaining the buffer output node 50 at a high logic level.

Thus, in accordance with the invention, hold stage 44 maintains the output voltage value at buffer output 50. Moreover, since the transistors of switch stage 42 are shut off, the output voltage value is isolated from disturbances caused by state transitions occurring on the switch power node 46 and the switch ground node 48. Consequently, a constant output signal is obtained, while disturbances to the buffer electronics is minimized.

Figure 3:
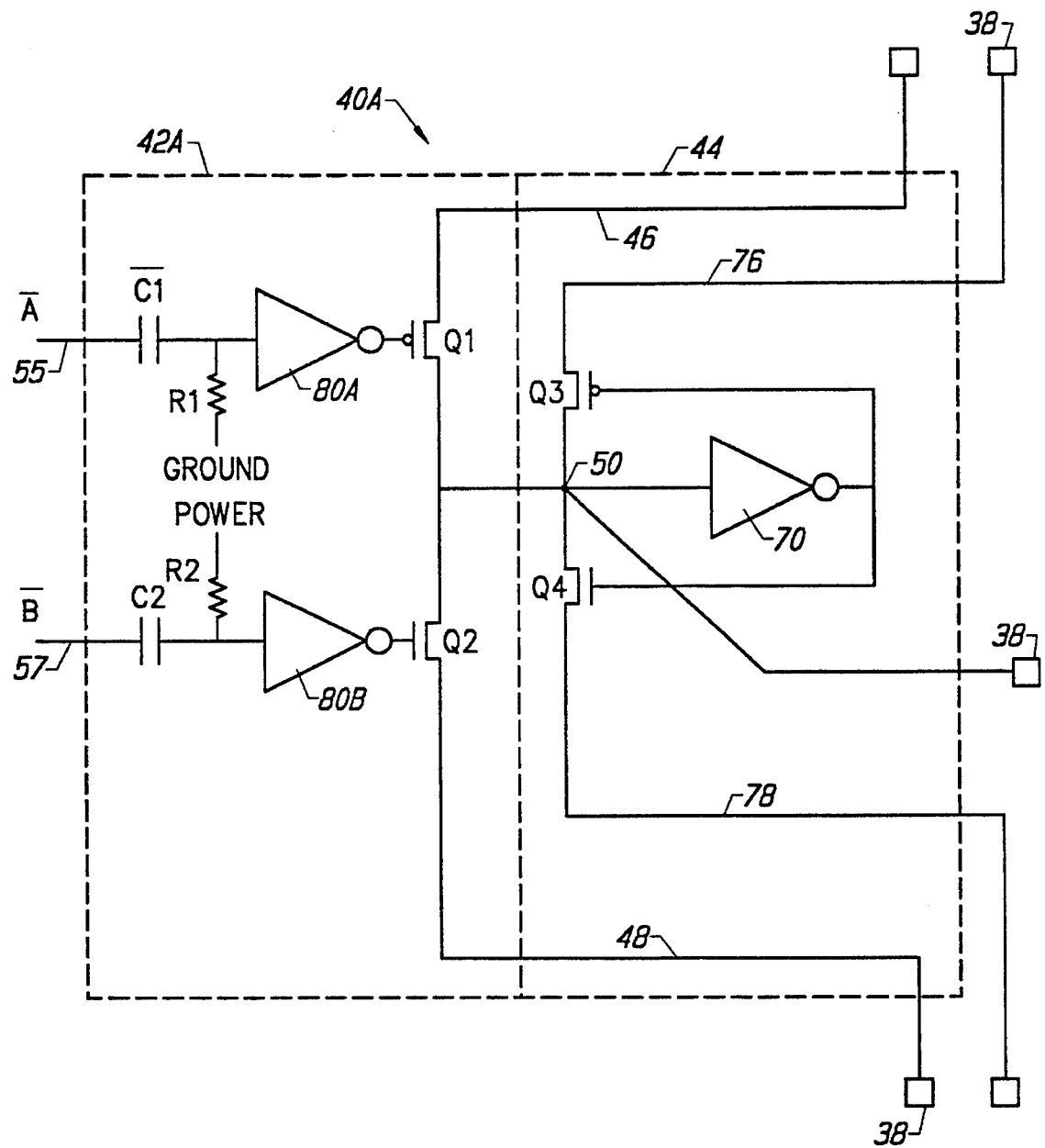
FIG. 3 depicts an alternate output buffer in accordance with the present invention.

FIG. 3 depicts an alternate embodiment 40A of the output buffer of the present invention. This output buffer 40A has a different switch stage 42A. In particular, switch stage inverters 80A and 80B are provided. In addition, resistor R1 is coupled to ground instead of power, while resistor R2 is coupled to power instead of ground. The switch stage inverters 80A and 80B respectively drive pull-up transistor Q1 and pull-down transistor Q2. The logic levels on input nodes 55 and 57 are inverted. The output buffer 40A is convenient because the signal value on input nodes 55 and 57 is reproduced on the output node 50. The output buffer 40 of FIG. 2, on the other hand, outputs a voltage signal that is the inverse or opposite of the input signal on nodes 55 and 57.

Figure 4:
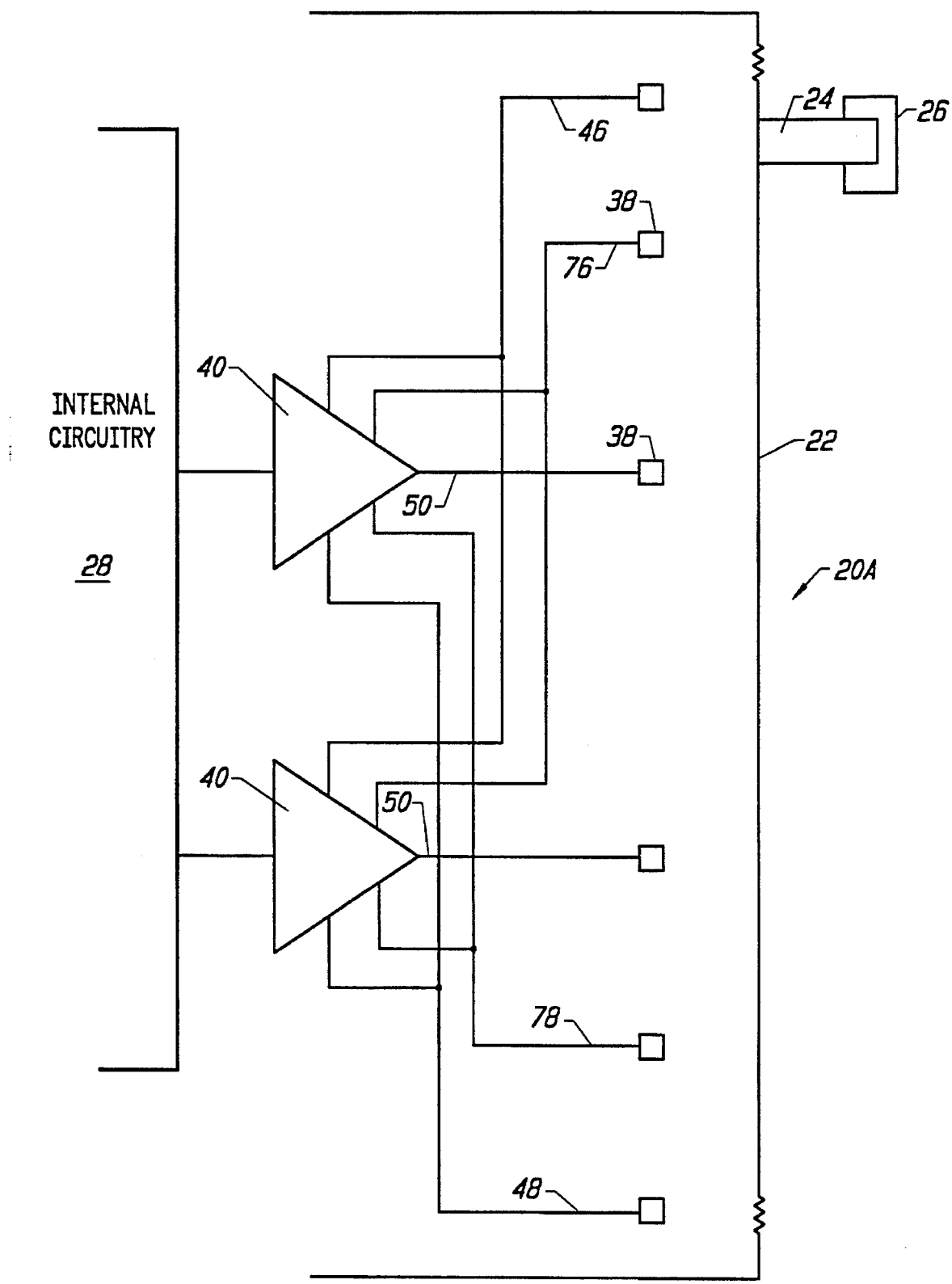
FIG. 4 depicts a number of output buffers of the present invention in a coupled arrangement, positioned within a package.

Turning to FIG. 4, two output buffers 40 of the present invention are depicted as part of an integrated circuit package 20A. The output buffers 40 are coupled to internal circuitry 28. The switch power input node 46, switch ground node 48, idling power input node 76, and idling ground node 78 are coupled to output pads 38, which are in turn coupled to leads 24 of the package 20A. In the preferred embodiment, the switch and hold circuits in the output buffers are connected to distinct power supply leads. Typically, the switch circuits 42 will use the same power connections as the internal circuitry 28. Because the output node 50 is isolated from the switch power input node 46 and switch ground node 48 during non-switching periods, or steady-state periods, a number of output buffers 40 may be coupled together without experiencing disturbances from ground bounce.

One skilled in the art will recognize a number of advantages associated with the present invention. In particular, the output buffer of the present invention is immune from disturbances such as transients and noise. The output buffer of the invention realizes immunity from disturbances without relying upon reducing the inductance of the package leads. In addition, a stable output signal is provided, while the transistors of the output buffer are isolated from disturbances.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. In an integrated circuit, an output buffer, comprising:

an input node that receives a logic signal;

first and second power supply nodes and first and second ground nodes;

a switching circuit coupled to said input node for generating an initial output voltage on an output node, said initial output voltage corresponding to said logic signal on said input node; said switching circuit coupled to said first power supply node and said first circuit ground node, said switching circuit including a pull-up transistor coupled to said first power node and a pull-down transistor coupled to said first ground node, said pull-up transistor and said pull-down transistor being shut off after said switching circuit drives said initial output voltage on said output node to a value corresponding to said logic signal, so that said output node is isolated from said first power supply node and said first circuit ground node; and an output holding circuit, coupled to said output node, said second power supply node and said second circuit ground node, said output holding circuit being driven solely in response to said initial output voltage so as to maintain an output voltage on said output node, wherein said output holding circuit includes a circuit element with an input directly connected to said output node, said circuit element being driven solely in response to said initial output voltage on said output node, and an output coupled to a pull-up hold transistor so that said pull-up hold transistor couples said output node to said second power supply node when said output voltage is at a high voltage level; wherein said circuit element output is also coupled to a pull-down hold transistor so that said pull-down hold transistor couples said output node to said second circuit ground node when said output voltage is at a low voltage level;

whereby said pull-up hold transistor and said pull-down hold transistor maintain said output voltage value on said output node.

2. The output buffer of claim 1, wherein said first and second power supply nodes and said first and second circuit ground nodes are coupled to a plurality of output buffers.

3. In an integrated circuit, an output buffer, comprising:

an input node that receives a logic signal;

first and second power supply nodes and first and second ground nodes;

a switching circuit coupled to said input node for generating an initial output voltage on an output node, said initial output voltage corresponding to said logic signal on said input node; said switching circuit coupled to said first power supply node and said first circuit ground node, said switching circuit including a pull-up transistor coupled to said first power node and a pull-down transistor coupled to said first ground node, said pull-up transistor and said pull-down transistor being shut off after said switching circuit drives said initial output voltage on said output node to a value corresponding to said logic signal, so that said output node is isolated from said first power supply node and said first circuit ground node; and an output holding circuit, coupled to said output node, said second power supply node and said second circuit ground node, said output holding circuit being driven solely in response to said initial output voltage so as to maintain an output voltage on said output node, wherein said output holding circuit includes an inverter with an input directly connected to said output node, said inverter being driven solely in response to said initial output voltage on said output node, and an output coupled to a pull-up hold transistor so that said pull-up hold transistor couples said output node to said second power supply node when said output voltage is at a high voltage level; wherein said inverter output is also coupled to a pull-down hold transistor so that said pull-down hold transistor couples said output node to said second circuit ground node when said output voltage is at a low voltage level;

whereby said pull-up hold transistor and said pull-down hold transistor maintain said output voltage value on said output node.

4. The output buffer of claim 3, wherein said first and second power supply nodes and said first and second circuit ground nodes are coupled to a plurality of output buffers.

5. In an integrated circuit, an output circuit, comprising:

first and second power supply nodes and first and second circuit ground nodes; and a plurality of output buffers that receive logic signals and generate corresponding output voltages on output nodes; said plurality of output buffers coupled to said first and second power supply nodes and said first and second circuit ground nodes;

each of said plurality of output buffers including:

an input node that receives one of said logic signals;

a switching circuit, coupled to said input node, for generating an initial output voltage on one of said output nodes, said initial output voltage corresponding to said logic signal on said input node; said switching circuit, coupled to said first power supply node and said first circuit ground node, and including a differentiating circuit that enables said switching circuit temporarily whenever said received logic signal changes value and then disables said switching circuit so that said output node is isolated from said first power supply node and said first circuit ground node, said differentiating circuit including a pull-up transistor coupled to said first power node and a pull-down transistor coupled to said first circuit ground node, said pull-up transistor and said pull-down transistor being shut off by said differentiating circuit after said switching circuit drives said initial output voltage on said output node to a value corresponding to said logic signal;

an output holding circuit, coupled to said output node, said second power supply node and said second circuit ground node, said output holding circuit being driven solely in response to said initial output voltage so as to maintain an output voltage on said output node, wherein said output holding circuit in each of said output buffers includes an inverter with an input directly connected to said one output node, said inverter being driven solely in response to said initial output voltage on said output node, and an output coupled to a pull-up hold transistor so that said pull-up hold transistor couples said one output node to said second power supply node when said output voltage is at a high voltage level; wherein said inverter output is also coupled to a pull-down hold transistor so that said pull-down hold transistor couples said one output node to said second circuit ground node when said output voltage is at a low voltage level;

whereby said pull-up hold transistor and said pull-down hold transistor maintain said output voltage value on said one output node.

6. In an integrated circuit, an output circuit, comprising:

first and second power supply nodes and first and second circuit ground nodes; and a plurality of output buffers that receive logic signals and generate corresponding output voltages on output nodes; said plurality of output buffers coupled to said first and second power supply nodes and said first and second circuit ground nodes;

each of said plurality of output buffers including:

an input node that receives one of said logic signals;

a switching circuit, coupled to said input node, for generating an initial output voltage on one of said output nodes, said initial output voltage corresponding to said logic signal on said input node; said switching circuit, coupled to said first power supply node and said first circuit ground node, and including a differentiating circuit that enables said switching circuit temporarily whenever said received logic signal changes value and then disables said switching circuit so that said output node is isolated from said first power supply node and said first circuit ground node, said differentiating circuit including a pull-up transistor coupled to said first power node and a pull-down transistor coupled to said first circuit ground node, said pull-up transistor and said pull-down transistor being shut off by said differentiating circuit after said switching circuit drives said initial output voltage on said output node to a value corresponding to said logic signal;

an output holding circuit, coupled to said output node, said second power supply node and said second circuit ground node, said output holding circuit being driven solely in response to said initial output voltage so as to maintain an output voltage on said output node, wherein said output holding circuit in each of said output buffers includes a circuit element with an input directly connected to said one output node, said circuit element being driven solely in response to said initial output voltage on said one output node, and an output coupled to a pull-up hold transistor so that said pull-up hold transistor couples said one output node to said second power supply node when said output voltage is at a high voltage level; wherein said circuit element output is also coupled to a pull-down hold transistor so that said pull-down hold transistor couples said one output node to said second circuit ground node when said output voltage is at a low voltage level;

whereby said pull-up hold transistor and said pull-down hold transistor maintain said output voltage value on said one output node.

\* \* \* \* \*